_United States Patent_ [19]

Kruger

[11] Patent Number: 4,847,183

[45] Date of Patent: Jul. 11, 1989

[54] HIGH CONTRAST OPTICAL MARKING METHOD FOR POLISHED SURFACES

[75] Inventor: James B. Kruger, Half Moon Bay, Calif.

[73] Assignee: Hewlett-Packard Company, Palo Alto, Calif.

[21] Appl. No.: 95,389

[22] Filed: Sep. 9, 1987

[51] Int. Cl.⁴ .............................................. G03C 5/00
[52] U.S. Cl. .................................... 430/322; 430/296;
430/323; 430/325; 430/326; 430/328; 430/394;
430/494; 430/942
[58] Field of Search ............... 430/296, 313, 317, 322,
430/323, 325, 326, 327, 328, 330, 394, 30, 494;
945, 942

[56] References Cited

U.S. PATENT DOCUMENTS

| | | | |
|---|---|---|---|
| 3,598,604 | 11/1968 | De Puy | 430/317 |
| 3,874,916 | 4/1975 | Livesay et al. | 430/296 |
| 4,229,520 | 11/1980 | Bratt et al. | 430/322 |
| 4,344,816 | 4/1982 | Craighead et al. | 156/643 |
| 4,368,245 | 1/1983 | Bayer | 430/326 |
| 4,403,151 | 9/1983 | Mochiji et al. | 430/326 |
| 4,426,247 | 1/1984 | Tamamura et al. | 430/317 |
| 4,591,540 | 5/1986 | Bohlen et al. | 430/311 |
| 4,594,263 | 6/1986 | Folk et al. | 427/53.1 |
| 4,610,940 | 9/1986 | Araihara | 430/394 |
| 4,614,706 | 9/1986 | Matsuzawa et al. | 430/296 |
| 4,650,744 | 3/1987 | Amano | 430/313 |
| 4,690,880 | 9/1987 | Suzuki et al. | 430/394 |

FOREIGN PATENT DOCUMENTS

| | | | |
|---|---|---|---|
| 0070772 | 6/1979 | Japan | 430/296 |
| 0043870 | 3/1980 | Japan | 430/296 |
| 0033827 | 4/1981 | Japan | 430/313 |
| 0082940 | 5/1982 | Japan | 430/313 |
| 0098942 | 6/1983 | Japan | 430/323 |
| 0042834 | 3/1985 | Japan | 430/323 |

_Primary Examiner_—Ellis P. Robinson
_Assistant Examiner_—Donald J. Loney

[57] ABSTRACT

Indicia, provided on a specularly reflective surface, are formed by a dot surface relief pattern featuring polygonal surfaces spaced apart to enhance scattering. The spacing of dots is characterized by a pitch in the range of 8 to 50 microns with a dot size of less than 50 microns and usually about one-half of the pitch dimension. In one embodiment, the dots may be anisotropically etched forming mesas, enhanced by gemlike polygonal facets which provide good optical contrast relative to the background surface.

15 Claims, 2 Drawing Sheets

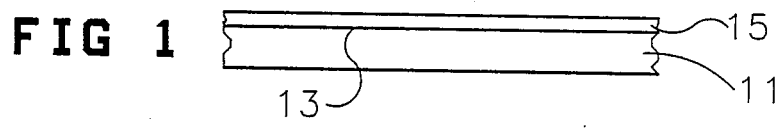
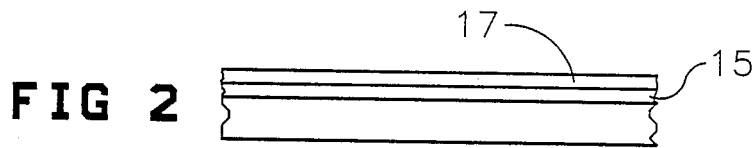
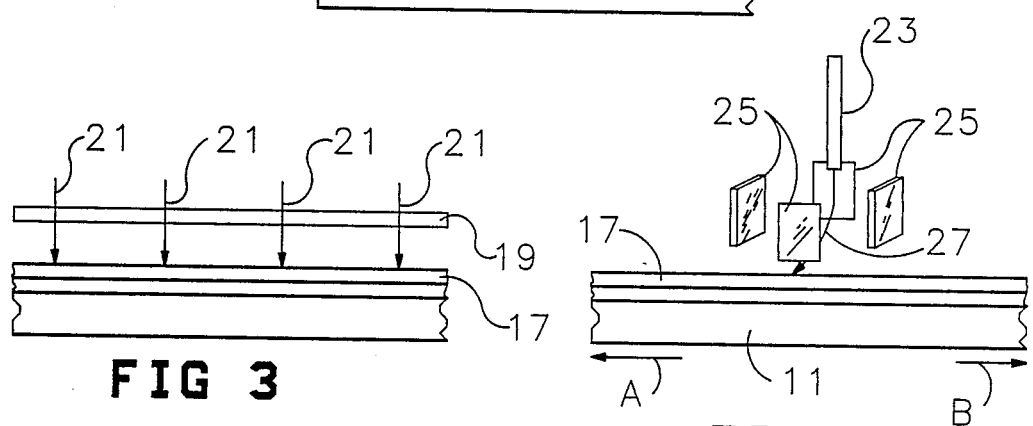
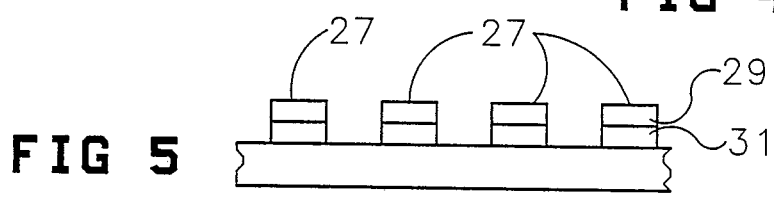
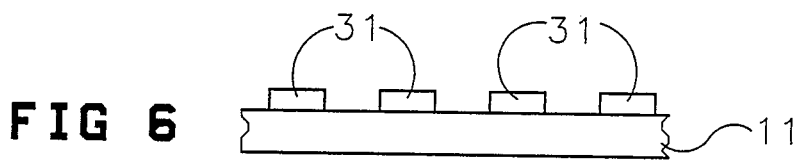

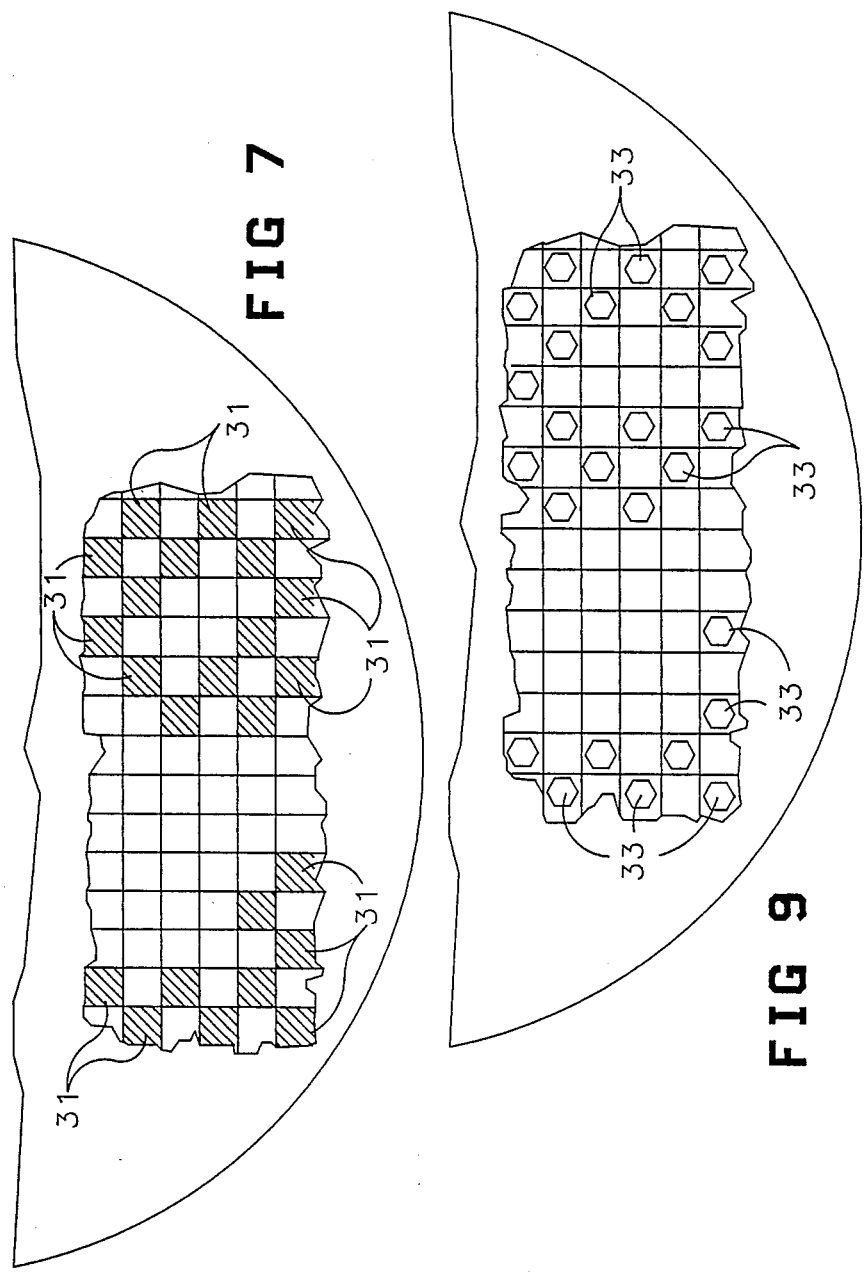

HIGH CONTRAST OPTICAL MARKING METHOD FOR POLISHED SURFACES

TECHNICAL FIELD

The invention relates to marking of surfaces with indicia, and more particularly to marking of semiconductor wafers and the like.

BACKGROUND ART

In the fabrication of integrated circuits, semiconductor wafers are usually processed in batches. In the initial stages of processing, wafers are thoroughly cleaned, polished, inspected and tested. It is frequently desirable to mark wafers with indicia indicative of the batch, including eye readable indicia which are useful in retrieving data regarding inspection, testing and manufacture of the integrated circuits.

Some wafer marking has been done by micromachining. In this process, a laser is used to ablate material on the wafer surface, etching a pattern which is controlled by the beam. In another micromachining approach, the laser scans a mask which allows light to pass through in desired locations. The light which passes through may either directly ablate material from the surface, or expose a light sensitive coating which is used to form the desired pattern.

In U.S. Pat. No. 4,594,263 L. Folk et al. disclose a laser marking system wherein an absorptive nickel oxide coating is placed on a surface for enhancing absorption of laser beam energy for ablation of underlying material.

U.S. Pat. No. 4,344,816 to Craighead et al. discloses formation of a surface mask in the form of hill-like structures which are spaced apart on the order of the wavelength of visible light. The hill-like structures are a mask for etching underlying material in an anisotropic etch so that pits are formed having a desired depth.

While formation of eye readable indicia on wafers and similar structures is known, one of the problems which has arisen is that such markings are frequently of low optical contrast and are difficult to read in ambient light.

An object of the invention has been to devise a wafer marking method which may be carried out in a wafer processing operation, yet which is characterized by high optical contrast under ambient light.

DISCLOSURE OF INVENTION

The above object has been met by providing a dot relief pattern in a specularly reflective base surface featuring polygonal side surfaces angularly inclined relative to the base surface and spaced apart relative to neighboring side surfaces to enhance scattering. In one embodiment, a checkerboard arrangement of dots, formed by mesas or pits, has spacing between dots in a selected range. Light scattering between dots is enhanced for this selected range with significant optical contrast with respect to the background specularly reflective surface. Dots spaced outside of the selected range do not exhibit as high optical contrast. A checkerboard arrangement is not necessary, but is beneficial because it provides an acceptable number of light scattering surfaces or polygonal facets, combined with spacing between similar surfaces of neighboring dots so that light can interact with other facets associated with other dots and with the reflective background.

The dots are prepared on or in a surface, such as a polished semiconductor wafer, by coating with a layer of radiation sensitive material, such as resist. The sensitive material is selectively exposed by actinic radiation, namely optical, x-ray, electron or ion beam radiation, or by masked flood radiation, with the dots being spaced with a pitch, i.e. pattern repetition distance, in the range of 8 to 50 microns and a dot size which is approximately half of the pitch. The dot-checkerboard pattern is laid out to form letters, numbers, and the like having a height of several millimeters. The pattern is treated to provide surface relief with the three-dimensional character of the dots enhancing light scattering.

In one construction method, the pattern is laid out in a checkerboard, including rows and columns, with the exposed portion of the pattern becoming optically contrasting with respect to the non-exposed portion. Exposure may be by two doses of actinic radiation, with a first dose exposing the desired pattern, such as a checkerboard, and a second dose darkening the dots which are to be laid out to form eye readable characters. After development of the exposed material, the dot pattern is etched to provide surface relief or texturing. In the case where a liquid etchant is used on a crystalline substrate, such as a silicon wafer, it is possible to provide anisotropic etching to produce polygonal gemlike facets. The resultant characters have very high visibility and are formed without damaging or contaminating an ultra clean surface.

BRIEF DESCRIPTION OF THE DRAWINGS

FIG. 1 is a cross sectional view of a substrate having an oxide coating layer.

FIG. 2 is a cross sectional view of the substrate of FIG. 1 with an oxide coating layer covered by a layer of resist.

FIGS. 3 and 4 are cross sectional views of the resist layer of FIG. 2 being exposed to electron beam radiation.

FIG. 5 is a cross sectional view of the layered substrate of FIGS. 3 and 4 showing the selective removal of resist and oxide after exposure to electron beam radiation, development and oxide etch.

FIG. 6 is a cross sectional view of the layered substrate of FIGS. 3 and 4 showing removal of the resist remaining after the treatment illustrated in FIG. 5.

FIG. 7 is a top view of the article illustrated in FIG. 6.

FIG. 8 is a cross sectional view of the layered substrate illustrated in FIG. 6 after etching in an orientation dependent etch and before removal of the oxide mask.

FIG. 9 is a top view of the layered substrate illustrated in FIG. 8 after removal of the oxide mask.

BEST MODE FOR CARRYING OUT THE INVENTION

With reference to FIG. 1a planar substrate 11 is shown. The substrate may be any flat surface to be marked, such as a cleaned and polished semiconductor wafer. The substrate should be specularly reflective to ambient light, such as polished silicon wafers are. The present invention has special utility for marking semiconductor wafers because the processing steps may be carried out in connection with wafer fabrication. Yet a wafer surface is difficult to mark because it is most important to avoid damage and any form of particulate debris or dirt. The processing of wafers utilizes electron beam lithographic techniques which, prior to printing integrated circuit patterns on the wafer, involve the placement of fiducial marks by exposing and developing resist patterns followed by etching the patterns into the substrate. The present invention may be carried out in connection with making such fiducial marks, or independently therefrom.

Above the planar surface 13 of substrate 11 a layer of oxide is grown on the wafer, normally at a temperature in the range of 900° to 1200° C. Oxide thickness is typically 0.1 to 1.0 microns, although it may be more or less.

FIG. 2 shows the next step involving deposition of a photosensitive or electron beam sensitive layer 17 over oxide layer 15. The sensitive layer is typically "photoresist" or "resist". Resist is usually applied by deposition onto a wafer spinning at high speed. A uniform coating is achieved by flowing of the liquid from the center of the wafer radially outwardly under centrifugal force.

FIGS. 3 and 4 show alternate methods of exposing the resist. In FIG. 3, a mask 19 is provided having apertures which allow light to pass through in the vicinity of arrows 21 representing light rays. The remainder of the mask is opaque and blocks light from impinging upon certain regions of resist layer 17. In FIG. 4, an e-beam apparatus is schematically shown by beam generating tube 23 and electromagnetic deflection plates 25 which serve to steer beam 27 to specified portions of resist layer 17. In each instance the substrate has been aligned in a desired orientation for circuit layout. Substrate 11 is movable in the directions of the arrows A, B so that the desired pattern may be written over any portion of the coated substrate. Beam tube 23 is used to expose fiducial patterns on the wafer, for later use by a step-and-repeat camera, at the same time as the dot patterns described herein. The fiducial marks are typically line patterns which define the approximate location of one or more integrated circuits on a wafer. The advantage of an e-beam apparatus is that it forms lines on the order of 1 micron or less in width. Such lines allow for high resolution definition of objects on the surface of the resist and ultimately on the surface of the wafer. A key advantage of a serial writing method, such as an e-beam, for labeling is the ease of customizing each label so as to make it unique.

Once the photoresist has been selectively exposed by any suitable actinic source, whether optical, electron, ion or other source and whether by a masked flood exposure or by a scanned beam apparatus or a combination of the two, the photoresist is developed so that the softer portion is removed. This development is usually done with wet solvents or chemicals but may also be done by other means. Depending on whether the resist is "positive" or "negative", the exposed portion is either soft or hard. After resist development, the resulting resist pattern may be hardened by a post-bake, exposure to flood radiation, or both. The oxide layer can then be etched by suitable means, whether by wet chemicals or by plasma etch. FIG. 5 shows islands 27 each having a photoresist portion 29 over an oxide portion 31. Between these islands, other resist and oxide portions have been removed.

In FIG. 6, the remaining resist has been removed, leaving oxide regions 31, forming an oxide mask over substrate 11. In the top view of FIG. 7, oxide regions 31 are shown by cross hatching in a checkerboard pattern. This checkerboard pattern is important because it provides spatial separation between adjacent oxide islands, termed dots. The dots will ultimately become visible and the spacing and separation of dots is important. The pitch of the dots is defined as the distance between corresponding edges of a dot. Normally, this would include the distance across one of the dots plus the space separating two dots.

In forming eye readable characters, lines having a total width of 100 to 200 microns are preferred while a character height of approximately 1 to 2 mm. or more is preferred. If a pitch of 10 micrometers is selected, a line width would consist of at least 8 dots across plus intervening spaces. If a pitch substantially greater than 10 micrometers is selected, light will not encounter a sufficient number of scattering polygonal surfaces or facets. On the other hand, if a pitch substantially smaller is selected, light will be too widely defracted, reducing contrast, longer writing times will occur for scanned beams and the resulting marks formed by dot patterns would be too fragile in process steps occurring during the fabrication of integrated circuits. The selected dot pattern should have a relatively large number of linear edges, forming polygonal light scattering surfaces angularly inclined, perhaps upright, relative to a specularly reflecting base surface. The dots appear to have gem-like facets, as opposed to hemispherical craters which lack such features and which have characterized marking styles of the prior art. The distinctive marking patterns formed by the method of the present invention are directly attributable to light scattering from the gem-like facets of the dots and from the specular wafer surface occupying the space between dots. The present invention requires specularly reflective zones between dots and for this reason a highly polished silicon or other similar wafer surface is ideal. A dominant consideration in choosing the pitch and depth of the texturing pattern is that the resulting label not be easily immersed or damaged by subsequent steps in, for example, integrated circuit manufacture. The recommended depth of 2-3 microns and pitch of 25 microns serve well for most integrated circuit manufacturing.

Please note that in the checkerboard, alternate columns and rows are offset to provide spaces between adjacent columns and rows. In speaking of a width of 8 dots across, no dots are counted in the offset rows or columns and only one dot is counted in each non-offset row or column.

The final step in dot preparation involves etching of the oxide and the silicon therebetween. This may be done by either a wet etch, such as a KOH etch, or a reactive ion etch. A few microns of silicon are removed in the process, in zones 30 of FIG. 8, between mesas 33. Where a liquid etch is used, it has been found that where a checkerboard pattern has been established etching is anisotropic, having preferred directions corresponding to crystal planes. The resulting structure has the appearance of mesas 33 with gem-like facets in FIGS. 8 and 9, represented by lines 35. These facets enhance scattering of light. Interference effects between light scattered from various portions of the textured dot array are controlled by choosing the pitch of the textured pattern to be larger than about 5 to 10 times the average wavelength of the illuminating light. Too small a pitch would disperse the light too widely, reducing contrast. In some applications, moderate interference effects might be employed by appropriate choice of smaller pitch to give color contrast in the case of illumination by white light or to optimize the scattering angle in the case of illumination by monochromatic light. In FIG. 9 it may be seen that mesas in portions of the checkerboard pattern may be grouped to form eye readable characters.

The patterns of FIGS. 7 and 9 are greatly magnified portions of a surface strip where a whole pattern may be placed. To form eye readable characters there should be at least 8–10 dots in non-offset rows or columns. This is not shown in FIGS. 7 and 9 which have fewer dots in non-offset rows and columns.

In both the wet-etched and dry-etched examples that follow, a two-dose method for generating the labels is used for convenience with the JEOL 6A II exposure system to generate checkerboard textured labels while preserving use of the built-in label generator. A preferred method would be to modify system software to enable the checkerboard textured characters to be written directly by the label generator, enabling direct writing of each wafer. This two-dose method might be used to advantage in any exposure system including a pattern memory and a separate index or label generator.

EXAMPLE 1

The following example is a wet etch procedure. The wet method results in cleaner wafers more suitable for integrated circuit processing. The dry method involves fewer steps.

The wet method as described only works for silicon wafers with <100> surface orientation. Other silicon etchants must be used for other orietations.
1. Grow 200 nm. oxide on polished silicon wafer.
2. Dehydration bake, 160° C. convection oven.
3. Apply adhesion promoter: vapor HMDS (hexamethyl disilazane).
4. Spin resist PMMA to 500 nm. thickness.
5. Soft bake 160° C. 1 hour convection oven.
6. Electron beam expose using JEOL 6A II:
   fiducial pattern at a dose of 80 uC/cm$^2$
   then use two-dose exposure method for characters
   checkerboard overlay at 36 uC/cm$^2$
   label characters at 36 uC/cm$^2$
7. Develop in 1:1, MIBK:IPA (methyl isobutyl detone:isopropyl alcohol).
8. Rinse in isopropyl alcohol, dry.
9. Post-bake 110° C. convection oven, 30 minutes.
10. Etch oxide in 5:1 buffered HF (5 NH4F:1 HF) for 2–3 min. Rinse in distilled water.
11. Remove resist: 02 plasma or 2:1 $H_2SO_4:H_2O_2$. Rinse in distilled water, dry.
12. Etch silicon: pre-clean with 5 second dip in 10:1 buffered HF, rinse in distilled water, don't dry; etch silicon in 40 wt % KOH at 40° C. for 45 minutes. Expected depth is 2–3 microns. Rinse in distilled water, dry.
13. Clean in 2:1 $H_2SO_4:H_2O_2$. Rinse in distilled water, dry.
14. Store wafers with oxide in place until resumption of integrated circuit processing.

EXAMPLE 2

The following example is a dry etch method:
1. Dehydration bake of polished silicon wafer, 160° C. 1 hr.
2. Apply adhesion promoter, vapor HMDS.
3. Spin 2 microns of AZ 2400.
4. Soft bake 90° C. 30 minutes.
5. E-beam expose at dose of 50 uC/cm$^2$ for fiducials, 23 uC/cm$^2$ for both checkerboard overlay and label using two-dose method.
6. Develop in 1:1 MF312:distilled water. Rinse in distilled water, dry.
7. Post-bake 110° C. 30 minutes.
8. Harden resist by exposure to deep UV (254 nm wavelength) followed by 200° C. bake for 1 hr. in convection oven.
9. Plasma etch in Applied Materials 8810:
   gas flows:
      30 sccm CCl4
      120 sccm He
   pressure: 25 mTorr
   power:
      1200 watts
   time:
      25 to 30 min for a depth of 2.5 to 3 microns.
10. Strip resist in 2:1 $H_2SO_4:H_2O_2$. Rinse in distilled water, dry.

While the present invention has been described with regard to wafer fabrication, similar structures, such as circuit boards and coated lenses may be similarly marked, if appropriately reflective. Also, while mesas have been described, depressions such as pits could have been formed with almost equal effectiveness. The term "dots" should be understood to include "mesas" rising above the substrate or "pit" extending into the substrate, so long as polygonal reflective surfaces can be formed.

I claim:

1. A method of marking surfaces with indicia comprising:
   coating a specularly reflective surface with a layer of photosensitive or beam-sensitive material,
   exposing the sensitive material to actinic radiation in a dot-like pattern wherein the dots are spaced apart in an arrangement of columns and rows, the dot pattern laid out to form indicia wherein adjacent dots in a column and adjacent dots in a row have a pitch in the range of 8 to 50 microns and the ratio of dot size to the pitch is in the range of 3:10 and 7:10, and
   developing the dot pattern and removing either unexposed or exposed sensitive material to provide a surface relief dot pattern of indicia on an optically contrasting background, said exposing and said removing of the sensitive material being such as to render said indicia discernible to the unassisted eye.

2. The method of claim 1 further defined by offset spacing of adjacent dots in a checkerboard pattern of columns and rows with an equal pitch in the directions of said columns and said rows, said ratio of dot size to the pitch being approximately 1:2.

3. The method of claim 1 further defined by forming said dots into mesas.

4. The method of claim 3 wherein said mesas have polygonal facets.

5. The method of claim 2 wherein said checkerboard pattern has said dot pattern formed into mesas rising above said surface, said dot pattern formation carried out by etching said checkerboard pattern.

6. The method of claim 1 further defined by coating said surface with an oxide or nitride layer prior to coating with said layer of sensitive material.

7. The method of claim 6 further defined by removing the other of the unexposed or exposed sensitive material over the oxide or nitride, thereby leaving oxide or nitride mesas.

8. The method of claim 7 further defined by etching said oxide or nitride mesas.

9. The method of claim 8 further defined by liquid etching of said mesas to form polygonal facets.

10. The method of claim 1 wherein said surface coated with a layer of sensitive material comprises a polished reflective semiconductor surface.

11. A method of marking surfaces with indicia comprising,
coating a specularly reflective surface with a photosensitive or beam sensitive material,
exposing alternating areas of at least one region of the sensitive material to a recurring dose of actinic radiation in a manner so as to form a checkerboard pattern of rows and columns where the distance between repeating areas in a same row and in a same column of the checkerboard is in the range of 8 to 50 microns,
exposing said at least one region of the sensitive material to a character-forming dose of actinic radiation in a sequence to constitute indicia, areas of the checkerboard pattern receiving both of said dosages corresponding to dots in a dot pattern laid out to form indicia having line features sufficiently large to be visible to the unassisted eye when said dot pattern is developed and etched,
developing the dot pattern to provide optical contrast relative to said surface, and
etching the dot pattern to provide surface relief.

12. The method of claim 11 wherein etching is anisotropic providing dots in said pattern with polygonal facets.

13. The method of claim 11 wherein said exposing of sensitive material is through a mask bearing a checkerboard pattern.

14. The method of claim 13 wherein said exposing through said mask includes exposing of fiducial marks for a circuit layout through the same mask.

15. The method of claim 1 further defined by offset spacing of adjacent dots in a checkerboard pattern of columns and rows with an equal pitch in the directions of said columns and said vows, said ratio of dot size to the pitch being approximately 1:2.

* * * * *